United States Patent [19]

Ogawa et al.

[11] 4,415,818

[45] Nov. 15, 1983

[54] PROGRAMMABLE SEQUENTIAL LOGIC CIRCUIT DEVICES

[75] Inventors: Katsuhiko Ogawa, Yokohama; Shinju Horiguchi, Yokosuka, both of Japan

[73] Assignee: Nippon Telegraph & Telephone Corp., Japan

[21] Appl. No.: 110,030

[22] Filed: Jan. 7, 1980

[30] Foreign Application Priority Data

Jan. 16, 1979 [JP] Japan .................................. 54/3597
Feb. 6, 1979 [JP] Japan ................................. 54/12461

[51] Int. Cl.³ ......................................... H03K 19/177
[52] U.S. Cl. .............................. 307/465; 340/825.83; 340/825.88; 364/716
[58] Field of Search ............... 307/465, 466, 467, 468, 307/469; 364/716, 900 MS File; 340/166, 825.79, 825.83, 825.85, 825.87, 825.88

[56] References Cited

U.S. PATENT DOCUMENTS 3,230,355  1/1966  Chu ..................................... 364/716
3,566,153  2/1971  Spencer, Jr. ......................... 307/465
4,032,894  6/1977  Williams .......................... 364/716 X
4,336,601  6/1982  Tanaka ............................ 307/465 X

OTHER PUBLICATIONS

J. W. Jones, "Asynchronous Sequential Control . . . ", IBM Tech. Disclosure Bulletin, vol. 18, No. 3, Aug. 1975.

G. B. Long, "Input Bus Switching for PLA", IBM Tech. Disclosure Bulletin, vol. 20, No. 3, Aug. 1977.
L. C. Eggebrecht and H. E. McKinney, "Programmable Logic Array with Provision for Interrupts", IBM Tech. Disc. Bull., vol. 20, No. 2, Jul. 1977.
K. Andres, "MOS Programmable Logic Arrays", A Texas Instrument Application Report, Number CA-158, Oct. 1970.

Primary Examiner—Larry N. Anagnos
Assistant Examiner—David R. Hudspeth
Attorney, Agent, or Firm—Townsend and Townsend

[57] ABSTRACT

The programmable sequential logic circuit device is constructed to sequentially form an output signal to an external circuit and the circuit state for the next operation in accordance with input signals applied from outside and the internal state of the circuit. The device includes a first logic array for producing product terms of the input signals, a second logic array for producing sum terms of the first logic array, a two-dimensionally arrayed flip-flop array and means for setting the state of the flip-flop array. The flip-flop array is arranged in a plurality of rows of stages each including a plurality of serially connected flip-flop circuits. The inputs of respective rows are connected to the outputs of the second logic array, the outputs of the setting means are applied to the inputs of respective stages and the outputs thereof are parallelly fed back to the first logic array.

5 Claims, 21 Drawing Figures

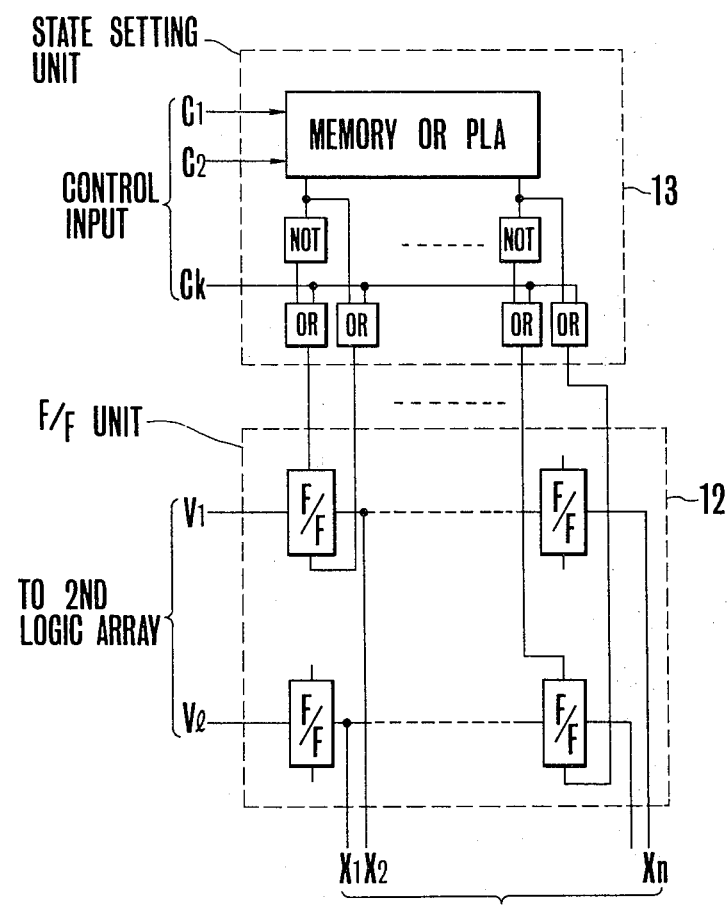

F I G. 3

| COMPONENT ELEMENTS / FIELD OF APPLICATION | 1ST LOGIC ARRAY | | 2ND LOGIC ARRAY | | |
|---|---|---|---|---|---|
| | AND GATE ARRAY | DECODER | OR GATE ARRAY | EX-OR GATE ARRAY | F/F ARRAY |
| SERIAL SIGNAL GENERATING CKT | ○ | ○ | ○ | ○ | ○ |
| LINEAR SEQUENTIAL CKT | ○ | | | ○ | |
| IMAGE PROCESSING CKT | ○ | ○ | ○ | | |

CASE I : [pattern] OR [pattern] ⇒ D=1

CASE II : [pattern] ⇒ S=1

CASE III : [pattern] ⇒ L=1

● BLACK DOT
○ WHITE DOT

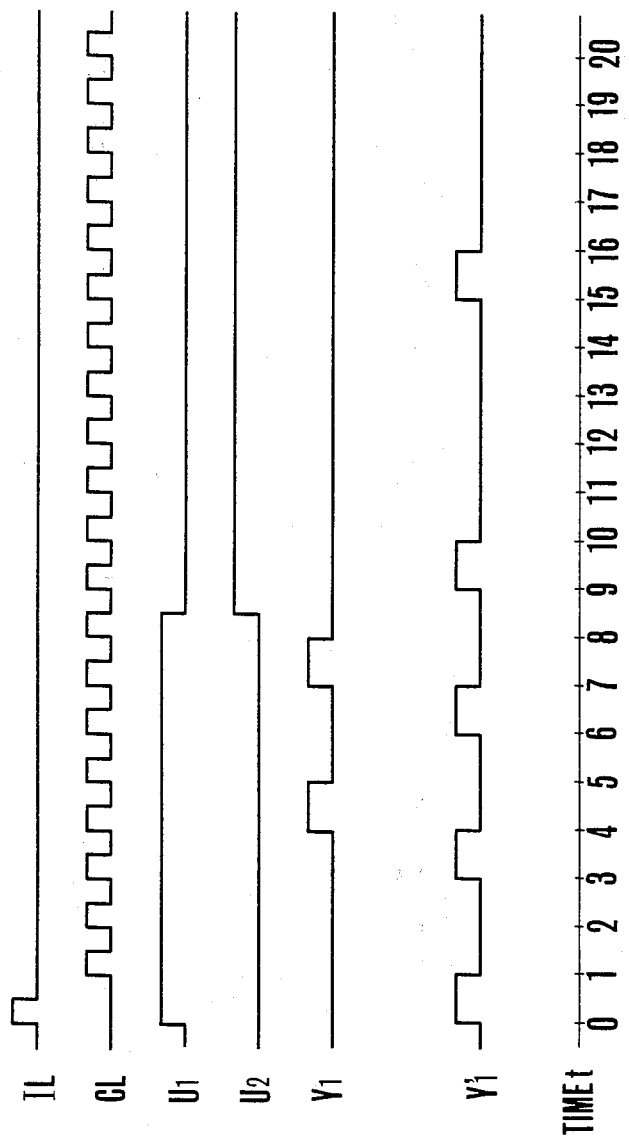

F I G.11
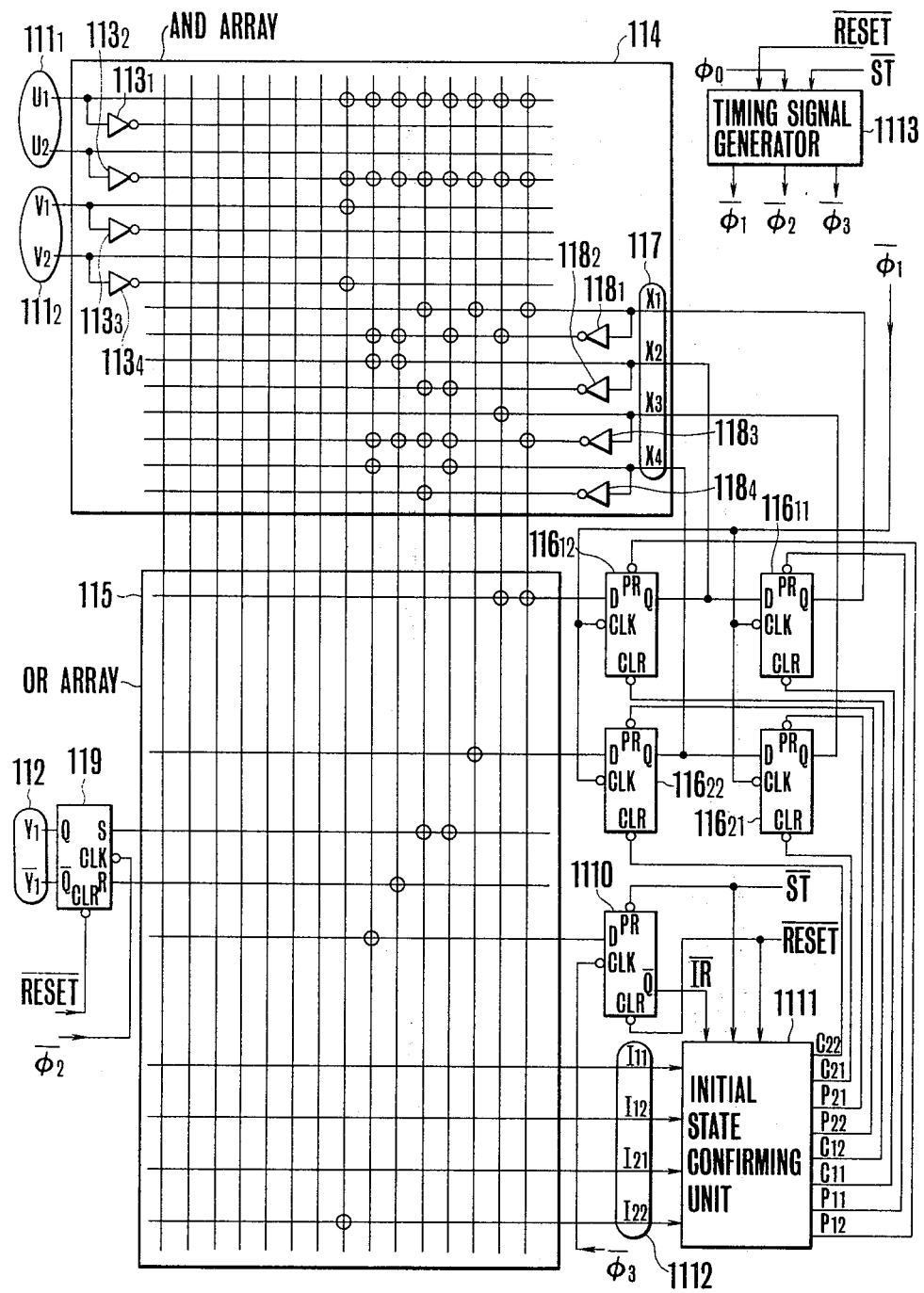

PROGRAMMABLE SEQUENTIAL LOGIC CIRCUIT DEVICES

BACKGROUND OF THE INVENTION

This invention relates to a programmable sequential logic device, more particularly a programmable sequential logic circuit including a shift register in which a plurality of externally controllable flip-flop circuits are arranged two-dimensionally to act as a memory element of the circuit device.

A sequential circuit is a switching circuit whose output is governed not only by the present input state but also by the past input condition, and the logic circuit of such sequential circuit has conventionally been constructed by a wired logic utilizing a counter, a decoder, an AND gate circuit, an OR gate circuit, a flip-flop circuit or like circuit elements. For this reason, in order to generate a different type of sequential signal from a circuit designed to generate one type of sequential signal, it is necessary to change the logic wiring of the circuit. Thus, it has been impossible to generate the sequential signal of different type with the same circuit construction, that is, to generate any desired sequential signal. To eliminate this defect, a programmable sequential logic circuit device has been proposed in which the logic circuit is constructed by replacing the combinational circuits with a programmable logic array (PLA).

Generally, a programmable logic circuit device utilizing a PLA comprises an input decoder supplied with an input logic signal, an AND gate array with its input terminal supplied with the output of the input decoder, an OR gate array connected to the output of the AND gate array, a feedback register connected in the feedback line between the output of the OR gate array and the feedback terminal of the AND gate array, and an output register connected to the output terminal of the OR gate array. When the contents of the feedback register and the input of the input decoder are applied to the product term line of the AND gate array corresponding to a desired program, the program is processed by the logic of the OR gate array utilized to produce an output, whereas the feedback output of the OR gate array varies the present content of the feedback register, thereby determining the subsequent content to be fed back to the AND gate array.

One example of the programmable sequential logic circuit of the type just described is disclosed in U.S. Pat. No. 3,566,153 to Ralph F. Spencer et al entitled "Programmable Sequential Logic", issued on Feb. 23, 1971. This patent utilizes a shift register and a plurality of flip-flop circuits as a memory element and is constructed to effect a timing control of input/output terminal devices of a digital computer and to generate a serial signal applied to a counter, a memory device, a signal delay device, etc. For this purpose, in addition to the flip-flop circuits there is provided a serial-in-parallel out type shift register comprising a plurality of stages of a one-dimensional array and acting as a memory element, and a portion of the output of the shift register is fed back to the AND gate array. The provision of the shift register assures efficient utilization of lines between the OR gate array and the flip-flop circuits.

However, while the sequential logic circuit disclosed in this U.S. Patent and comprising the shift register including a plurality of one-dimensionally arrayed stages is suitable for use in applications resembling a serial signal generating circuit it is not suitable for in such applications as a linear sequential circuit and an image processing circuit. More particularly, in the field of linear sequential circuits and image processing circuits, the efficiency of utilizing product term lines decreases. Moreover, with the circuit disclosed in the U.S. Patent noted supra it is impossible to set to any value the content of the flip-flop circuits included in the feedback line in order to effect an interruption during operation of the circuit.

Another prior art example of a programmable sequential logic circuit utilizing a shift register is disclosed in a paper entitled "Asynchronous Sequential Control Using Programmable Logic Arrays", J. W. Jones IMB Technical Disclosure Bulletin, Vol. 18, No. 3, Aug. 1975. This prior art circuit utilizes a plurality of serial-in-serial-out type shift registers as a feedback register, so as to sequentially store in the shift register sequential data (for example, character codes) sent from an external circuit and to independently produce the outputs. The parity of the outputs is checked or the outputs are used to form control signals supplied to outside. Thus, the shift register merely acts as a buffer to shift the data and this prior art logic circuit is difficult to use as a serial signal generating circuit, a linear sequential circuit and an image processing circuit.

SUMMARY OF THE INVENTION

Accordingly, it is an object of this invention to provide a programmable sequential logic circuit device capable of efficiently constructing the hardware not only of a serial signal generating circuit but also of a linear sequential circuit and an image processing circuit with programmable logic elements with high efficiency, that is, with a relatively small number of output lines from OR array and product term lines.

Another object of this invention is to provide a programmable sequential logic circuit device capable of setting to any state the internal state of the circuit in order to permit an interruption while the circuit is operating.

According to this invention, there is provided a programmable sequential logic circuit, comprising a first logic array for producing product terms of a plurality of input signals; a second logic array for producing sum terms of the outputs of the first logic array; a two-dimensional array of flip-flop circuits having a first input terminal connected to the output of the second logic array, a second input terminal supplied with an external control signal for setting internal state of the circuit, and output terminals connected to the first logic array; and means connected to the second input terminal for setting the internal state in the circuit and for changing the internal state for permitting an interruption during the operation of the circuit thereby producing an output signal to an external circuit and for sequentially forming the state for next operation in accordance with the input signals and the present internal state.

BRIEF DESCRIPTION OF THE DRAWINGS

Other objects and advantages of the invention can be more fully understood from the following detailed description taken in conjunction with the accompanying drawings in which:

FIG. 2A through 2D show diagrammatic connections in respective blocks shown in FIG. 1;

FIG. 3 is a chart useful to explain the construction of the circuit device of this invention for various applications;

FIG. 8 is a chart showing the content of the PROM shown in FIG. 7;

FIG. 9 is a time chart useful to explain the operation of the circuit shown in FIG. 7;

FIG. 11 is a connection diagram showing in detail a portion of the circuit shown in FIG. 10;

DESCRIPTION OF THE PREFERRED EMBODIMENTS

The basic construction of the programmable sequential logic circuit device according to this invention will first be described with reference to FIG. 1. As shown, it comprises a first logic array 10 which forms logical products of such variables as input signals U1 to Um and state signals X1 to Xn, a second logic array 11 which forms logical sums or exclusive logical sums of input variables, that is the outputs V1 to Vl of the first logic array, a serial-in-parallel out type flip-flop unit 12 including a plurality of flip-flop circuits supplied with input variables, that is, some of the outputs W1 to WP (where $p \leq n$) of the second logic array 11, the flip-flop unit 12 forming an internal state of the programmable sequential logic circuit device, and a state setting unit 13 which produces signals for setting the states of the flip-flop unit in accordance with control signals C1 to Ck. The input signals U1 to Um are converted by the internal state of the sequential logic circuit into outputs Y1 to Yr which are derived out from the second logic array.

Figure 2A:
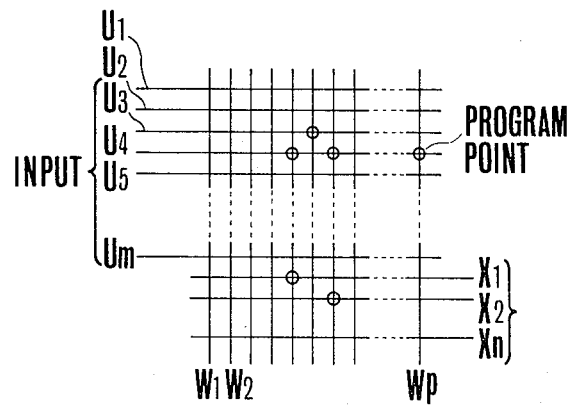
Figure 2B:
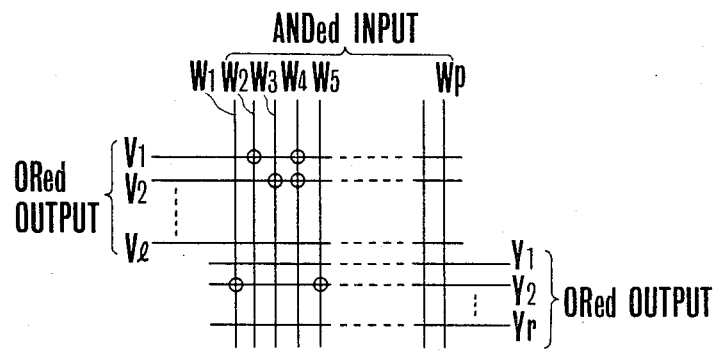
Figure 2C:
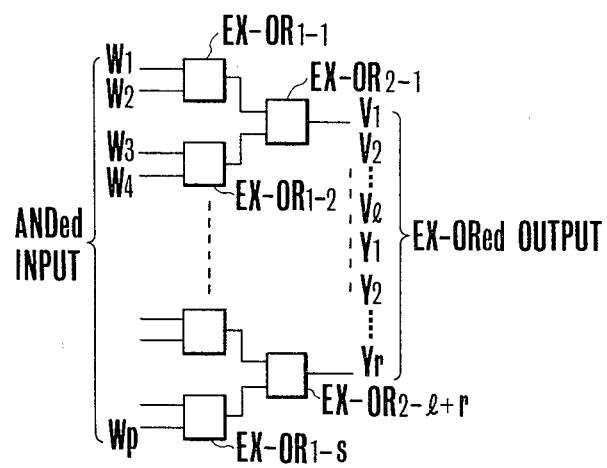

The first logic array is constituted by an AND gate array as shown in FIG. 2A in which the cross-points (shown by small circles) on row and column lines represent program points. Some of the row lines are supplied with input signals V1, V2 .... Vm while the others with state signals X1, X2 ... Xn. When programmed as shown in FIG. 2A, logical product outputs V1, V2 ... Vl comprising U4·X1 and U4·X2 can appear on product term lines. In accordance with the type of the field of application of the programmable sequential logic circuit of this invention, the second logic array 11 is constituted by an OR gate array or an exclusive OR gate array. FIGS. 2B and 2C show the operation and input/output lines of the logic array 11. When the logic array 11 is constituted by an OR gate array and programmed as shown in FIG. 2B, in response to the logical product inputs V1, V2 ... Vl from the product term lines of the first logic array 10, the logic array 11 will produce logical sum outputs W1, W2 ... WP corresponding to V2vV4 and V3vV4 and logical sum products Y1, Y2 .. . Yr corresponding to V1vV5. Where the second logic array 11 is constituted by an exclusive OR gate array as shown in FIG. 2C, an exclusive logical sum of the logical product inputs V1 and V2 from the product term lines of the first logic array 10 will be formed by an exclusive OR gate EX-OR$_{1-1}$ whereas the logical product inputs V3 and V4 are processed by an exclusive OR gate EX-OR$_{1-2}$ and an exclusive logical sum of the outputs of the exclusive OR gates are formed by an exclusive OR-gate EX-OR$_{2-1}$ to produce outputs W1, W2 ... WP and Y1, Y2 ... Yr.

According to this invention, the flip-flop circuits comprising the flip-flop unit or array 12 are arrayed two-dimensionally as shown in FIG. 2D. The first input terminal group of the flip-flop unit 12 is connected to receive the logical sum outputs W1, W2 ..., WP of the second logic array 11. The flip-flop circuits of each row are connected in series and respective flip-flop circuits are connected to respective logical sum output lines of the logic array 11 by lead wires. The second input terminal group of the flip-flop unit 12 leading from respective flip-flop circuits which are arranged in rows and columns is connected to respective output terminals of the state setting unit 13. The outputs of respective flip-flop circuits are connected to supply state signals X1 to Xn to the first logic array 10.

The state setting unit 13 performs to set not only the initial internal state of the programmable sequential logic circuit but also the internal state of the circuit for permitting an interruption during the operation of the circuit, that is, the state of respective flip-flop circuits of the flip-flop unit 12. The content of a memory device or a PLA of the state setting unit 13 is determined or changed by control signals C1 and C2 for determining a predetermined initial state at the commencement of the operation of the circuit and for setting any desired state during an intermediate point of the operation of the circuit, if desired. The content of the state setting unit 13 is applied to the flip-flop unit 12 through an inverter or an OR gate circuit so that the flip-flop unit 12 has a content corresponding to that of the state setting unit 13. The control input Ck is a clock pulse which is applied to the flip-flop circuits for setting the state thereof.

The programmable sequential logic circuit device constructed as described above operates to produce output signals Y1, Y2 ... Yr to an external circuit and successive states of succeeding operations. This operation will be described later in detail in connection with various embodiments.

By arraying two-dimensionally the flip-flop circuits and by connecting inputs and outputs thereof as described above, it becomes possible to program the internal state of the circuit necessary for a serial signal generating circuit, a linear sequential circuit and an image processing circuit not only at the start of the operation of the circuit but also at any intermediate point so that it is possible to decrease the number of the product term lines. For example, the number of flip-flop circuits arranged two-dimensionally necessary to determine all states of a linear sequential circuit may be determined by using controllability indices disclosed in P. Brunovsky and Kybernetika's paper of the title "A Classification of Linear Controllable Systems", Vol. 6, 3, 173/188, 1970. This method can reduce the number of redundant product term lines and flip-flop circuits.

FIG. 3 shows first and second logic arrays where the programmable sequential logic circuit device of this invention is applied to a serial signal generating circuit, a linear sequential circuit and an image processing circuit. Circles represent component elements utilized in respective circuits.

Figure 4:
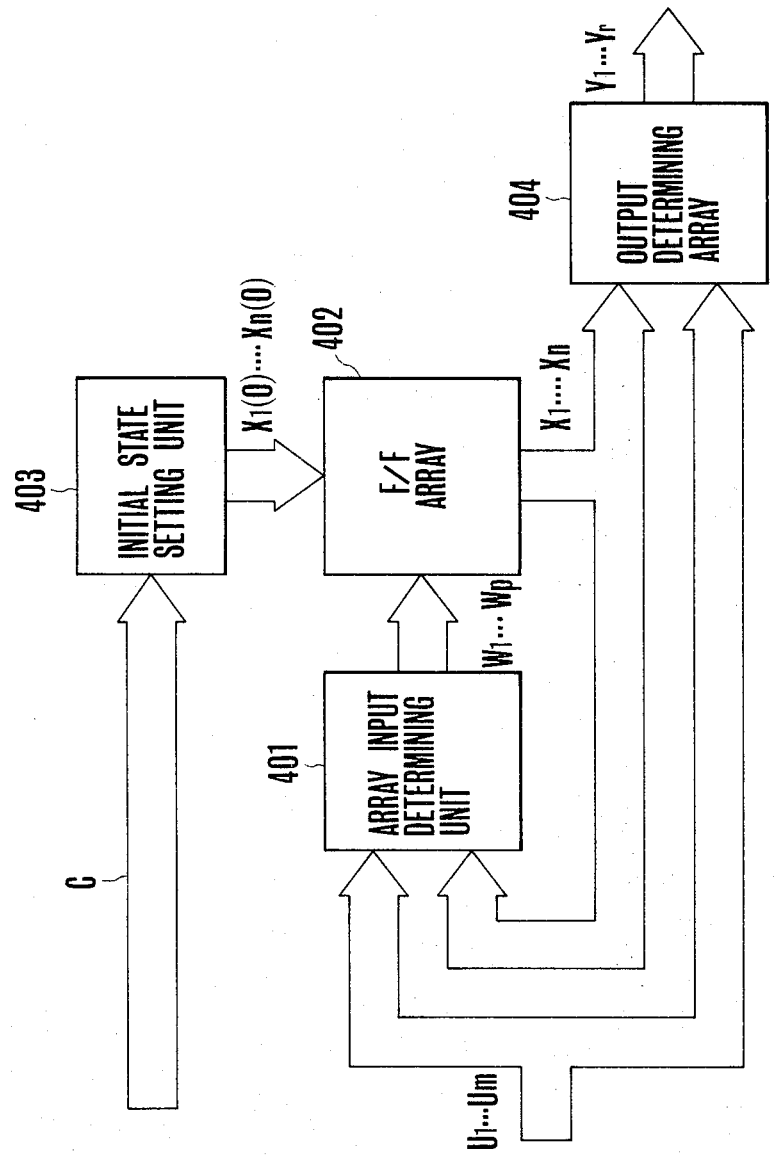
FIG. 4 is a block diagram showing one embodiment of a serial signal generating circuit according to this invention.

FIG. 4 shows one example of the application of this invention to a serial signal generating circuit which comprises an array input determining unit 401 which forms an input to a flip-flop array 402 based on external inputs and the internal state of the circuit. Thus, the array input determining unit 401 forms binary outputs $W1(t) \ldots WP(t)$ according to a logic function $gj (j=1 \ldots P)$ expressed by $$Wj(t) = gj (U1(t) \ldots Um(t), X1(t) \ldots Xn(t))$$

for binary inputs $U1(t) \ldots Um(t)$ and binary states $X1(t) \ldots Xn(t)$, where $j=1 \ldots P$, $P \leq n$ and t represents time.

The flip-flop array 402 determines its state at a time $(t+1)$ according to the following equation:

$$Xi(t + 1) = aiXi + 1(t)\overline{vai}Wj(t)$$

where $i=1 \ldots n$, $j=1 \ldots P$, $$ai = \begin{cases} 0 \ (i = Qj, 1 \leq Q1 \leq Q2 \ldots QP \leq N) \\ 1 \ (others) \end{cases}$$

and V represents a logical sum.

There is also provided an initial state setting unit 403 which in response to an external control input c sets the initial states of the flip-flop array 402 (although it is supposed herein to set the initial states $X1(0) \ldots Xn(0)$ at $t=0$, it is of course possible to set the states $X1(t0) \ldots Xn(t0)$ at any time to $\geq 0$). An output determining unit 404 is provided for producing binary outputs $Y1(t) \ldots Yr(t)$ according to a logic function fi $(i=1 \ldots r)$ expressed by an equation $$Yi(t) = fi(U1(t) \ldots Um, X1(t) \ldots Xn(t))$$

where $i=1 \ldots r$. Among these units the array input determining unit 401, the initial state setting unit 403 and the output determining unit 404 utilize such programmable logic units as a PLA, a PROM, a RAM, etc.

Figures 5, 17A:
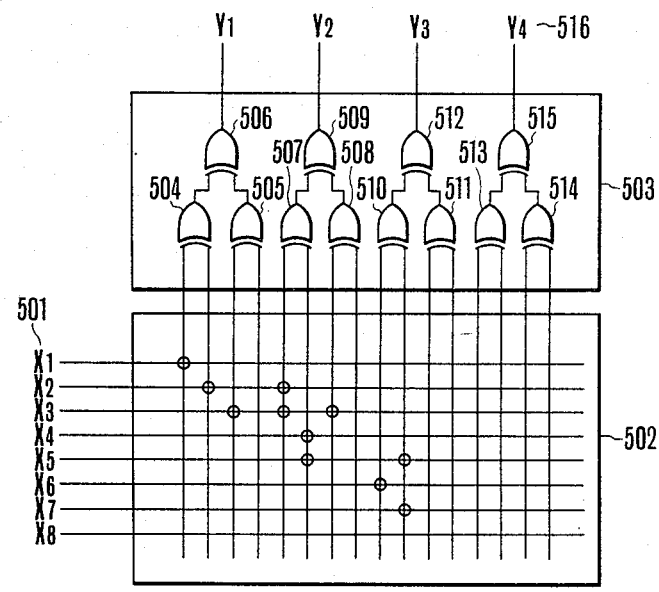
FIG. 5 is a connection diagram showing one example of a programmable logic circuit (PLA) of the AND-EX-OR gate type.
FIG. 17A shows one example of a dot pattern in terms of a 3×3 matrix.

FIG. 5 shows one example of a PLA of the AND-EXOR type. It comprises an AND gate array 502 which forms logical products of inputs 501 (X1 ... X8)—at least one of these inputs is always "1" for producing an inverted output—, and an exclusive logical sum array (EXOR array) which forms logical sums of the outputs on product term lines from the AND gate array 502. The exclusive logical sum array 503 comprises exclusive OR gate circuits 504 to 515 and produces an output 516. When the AND gate array 502 is programmed as shown by small circles, $Y1 = X1 \oplus X2 \oplus X3$, $Y2 = X2 \cdot X3 \oplus X4 \cdot X5 \oplus X3$, $Y3 = X6 \oplus X5 \cdot X7$ and $Y4 = 0$ can be obtained. In this example, although exclusive logical sum of the outputs on four product term lines are formed to obtain outputs, it is of course possible to form exclusive logical sums of the outputs on more than 5 product term lines by increasing the number of the exclusive OR gate circuits.

Figure 6:
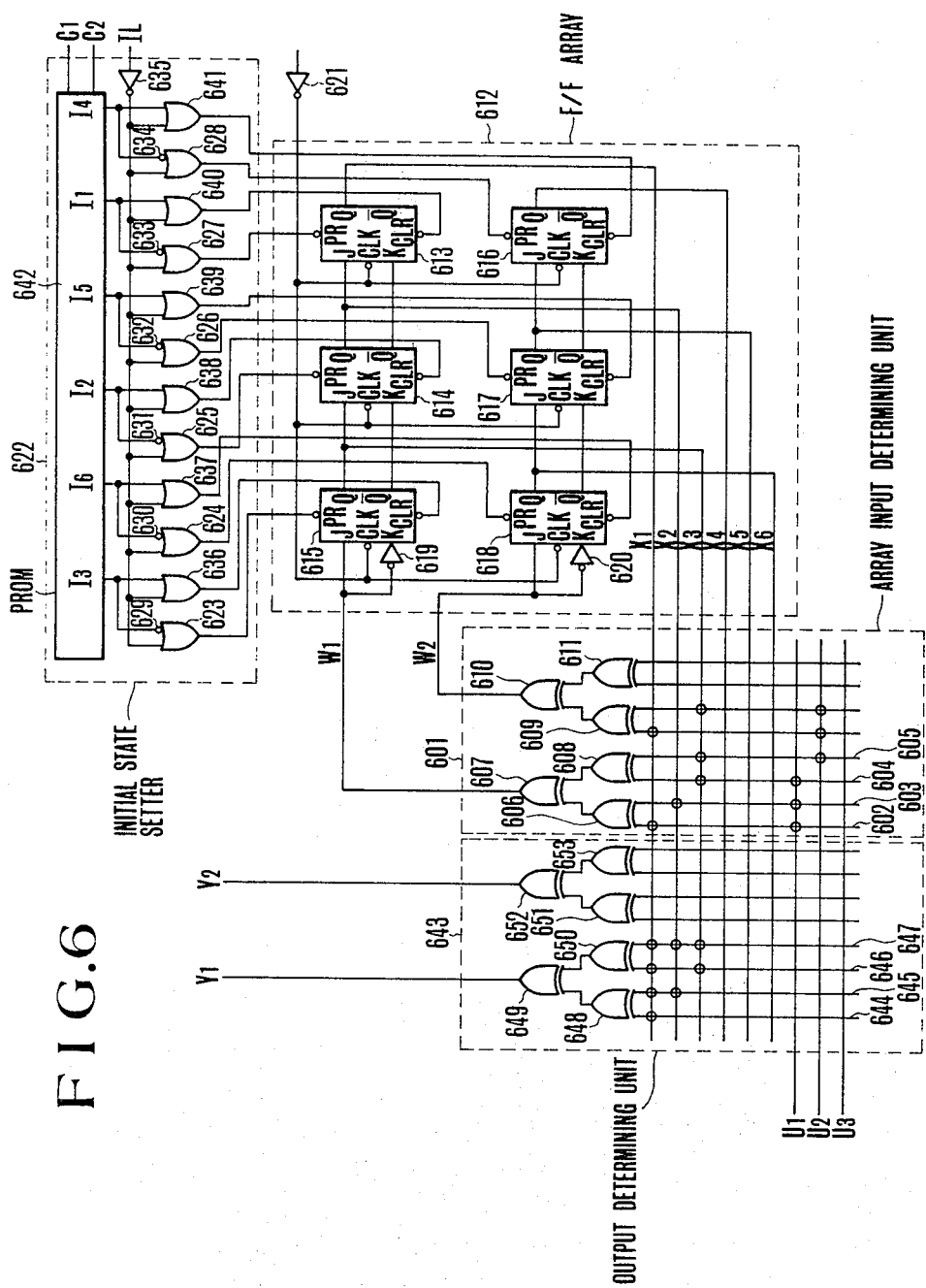
FIG. 6 is a connection diagram showing one example of a serial signal generating circuit utilizing the construction shown in FIG. 4.

FIG. 6 shows one example of a serial signal generating circuit utilizing a PLA of the AND-EXOR type shown in FIG. 5, in which 601 designates an array input determining unit which utilizes states $X1 \ldots X6$ and inputs U1, U2 and U3 as the inputs to the AND gate array to produce flip-flop array inputs W1 and W2 by forming exclusive logical sums (EXOR) of the signals on respective product term lines. A portion of these lines is shown by 602 to 605 of which line 602 is programmed to obtain a product term $X1 \cdot U1$, line 603 to obtain $X2 \cdot U1$, line 604 to obtain $X3 \cdot U1$ and line 605 to obtain $X3 \cdot U2$. The array input determining unit 601 comprises exclusive OR gate circuits 606 to 611. The exclusive OR gate circuit 606 utilizes product term lines 602 and 603 as its inputs, the exclusive OR gate circuit 608 utilizes the product term lines 604 and 605 as its inputs and the outputs of these exclusive OR gate circuits 606 and 608 are applied to the exclusive OR gate circuit 607 to produce the flip-flop array input W1. The flip-flop array input W2 can be obtained in the same manner. A flip-flop array 612 comprises a first row of serially connected flip-flop circuits 613 to 615, and a second row of serially connected flip-flop circuits 616 to 618. Although these flip-flop circuits are shown as of the JK type they may be of D or RS type. Inverters 619 and 620 are provided for the first and second rows. J and K terminals of the flip-flop circuit 613 are connected to the Q and $\overline{Q}$ output terminals of flip-flop circuit 614, and J and K terminals of the flip-flop circuit 614 are also connected to the Q and $\overline{Q}$ output terminals of flip-flop circuit 615. The J terminal of the flip-flop circuit 615 of the first row is supplied with the array input W1 while the K terminal of this flip-flop circuit is supplied with the input W1 via inverter 619. In the same manner, J and K terminals of the flip-flop circuit 618 of the second row are supplied with array inputs W2 and $\overline{W2}$. An inverter 621 is provided to invert clock signal CL. The inverted clock signal $\overline{CL}$ is applied to clock terminals CLK of the flip-flop circuits 613 to 618 so as to operate them at the rise of the clock signal CL.

An initial state setter 622 comprises OR gate circuits 623 to 628, inverters 629 to 635, OR gate circuits 636 to 641 and a PROM 642 addressed by the control inputs C1 and C2 to produce outputs I1 to I6. It will be clear that the PROM can be substituted by a PLA. The output I1 of the PROM 642 and a signal $\overline{IL}$ obtained by inverting the initial state setting signal IL by inverter 635 are applied to the OR gate circuit 640, and its output is supplied to clear terminal CLR of flip-flop circuit 613. A signal $\overline{I1}$ obtained by inverting the output I1 of PROM 642 by inverter 633 and the signal $\overline{IL}$ are applied to OR gate circuit 627 and its output is applied to the preset terminal PR of the flip-flop circuit 613. When signals supplied to terminals CLR and PR are "1", the flip-flop circuits operate or shift by the clock signal applied to the CLK terminal, and when terminal CLR is "0" and terminal PR is "1", Q output is "0", whereas when terminal CLR is "1" and terminal PR is "0", Q output is "1". Like output I1, the outputs I2 to I6 of PROM 642 are used to set the states of flip-flop circuits 614 to 618. The output states X1 to X6 of the Q terminals of these flip-flop circuits are parallelly fed back to AND gate circuits of the array input determining unit 601. An output determining unit 643 is constituted by a PLA of the AND-EXOR type to produce product terms of inputs U1 and U2 and states X1 to X6 and respective product term lines are connected to the EXOR array. Thus, the product term lines are designated by 644 to 647 and the exclusive OR gate circuits are designated by 648 to 653. Signals on the product term lines 644 to 647 are used to obtain product terms X1, X1·X2, X1·X3 and X1·X2·X3 while the exclusive OR gate circuits 648 to 650 produce exclusive logical sums to produce an output Y1. Another output Y2 is produced in the same manner.

In FIG. 6, three inputs, two outputs and six states were assumed, and the array input determining unit 601 and the output determining unit 643 were constructed to have 9 inputs and two outputs, while the flip-flop array 612 was constituted by two rows each including three cascade connected flip-flop circuits. However, where the number of inputs is m, the number of outputs is r and the number of the states is n, the array input determining unit 601 can be constructed to have (n+m) inputs and P outputs (P≦n) and the output determining unit can be constructed to have (n+m) inputs and r outputs. The flip-flop array may be constituted by P rows each including Qi (i=1 ... P) flip-flop circuits. At this time there are the relationships Qi≦n(i=1 ... P) and Q1+Q2+ ... +QP=n.

Figure 7:
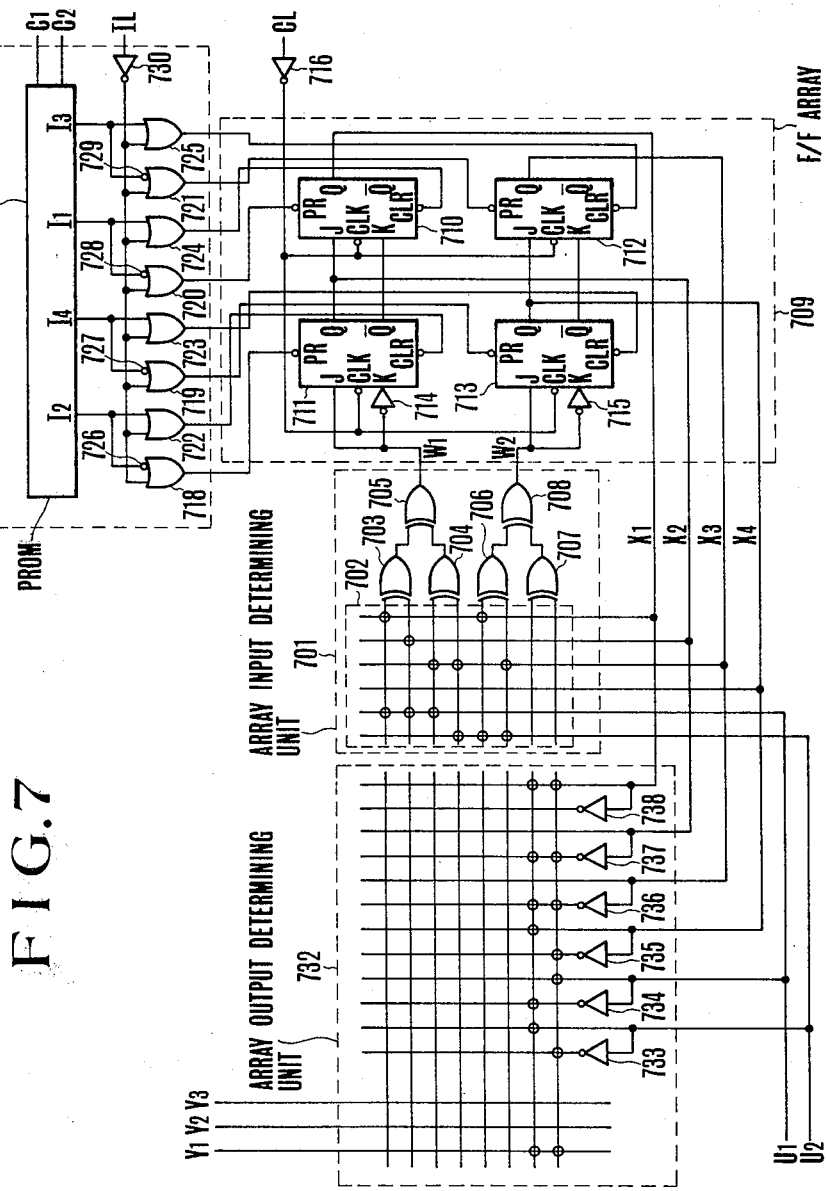
FIG. 7 is a connection diagram showing another example of a serial signal generating circuit utilizing the construction shown in FIG. 4.

FIG. 7 shows another example of the serial signal generating circuit utilizing a PLA of the AND-EXOR type and AND-OR type which is different from the circuit shown in FIG. 6 in that the output determining unit utilizes a PLA of the different type. In FIG. 7, 701 shows a PLA of the AND-EXOR type utilized in the array input determining unit, 702 an AND gate array of the PLA 701 which forms the product terms of inputs U1 and U2 and states X1, X2, X3 and X4. Reference numerals 703 to 708 represent exclusive OR gate circuits which form exclusive logical sums of the product terms produced by the AND array 702. A flip-flop array 709 is different from that 612 shown in FIG. 6 in that two rows of flip-flop circuits are provided each including two cascade connected flip-flop circuits. Flip-flop circuits 710 to 713 are operated by the fall of the clock signal CL applied to terminals CLK and can be preset and cleared. Inverters 714 to 716 are connected to flip-flop circuits 710 to 713 in the same manner as the flip-flop array 612 shown in FIG. 6.

An initial state setting unit 717 comprises OR gate circuits 718 to 725, inverters 726 to 730, and a PROM 731 which are connected in the same manner as the initial state setting unit 622 shown in FIG. 6. The output determining unit 732 comprises a PLA of the AND-OR type which includes inverters 733 to 738 acting to decode (1 bit decode) inputs U1 and U2 and states X1, X2, X3 and X4. The outputs of the inverters 733 to 738 are applied to an AND array of the PLA 732 to form product terms which are produced as outputs Y1, Y2 and Y3 via an OR array.

For the purpose of briefly describing the operation of the circuit shown in FIG. 7 let us assume as follows:

Thus, the following logic functions are programmed in PLA 701

$$W1 = U1(X1 \oplus X2 \oplus X3) \oplus U2X3$$

$$W2 = U2(X1 \oplus X3)$$

Furthermore, it is assumed that the PROM 731 has a content as shown in FIG. 8. Thus, control input signals C1 and C2 are inputted into addresses and the initial states I1, I2, I3 and I4 are set respectively in the flip-flop circuits 710 to 713 by the control signal IL. Further the following logic function is programmed in the PLA of the output determining unit 732.

$$Y1 = X1\overline{X2}\overline{X3}\overline{X4}U1\overline{U2} \vee X1\overline{X2}\overline{X3}X4\overline{U1}U2$$

FIG. 9 is a time chart showing the operation of the circuit shown in FIG. 7 in which IL shows an initial state setting signal, CL a clock signal for operating the flip-flop circuits 710 to 713, U1 and U2 input signals, Y1 an output signal when control input signals C1="1" and C2="0" and Y'1 an output signal when input signals C1="0" and C2="1". Under these assumptions the actual operation is as follows.

Where control inputs C1="1" and C2="0", the initial state setting signal IL becomes "1" at t=0. At this time, I1=I2=I3="0" and I4="1" so that the outputs of the OR gate circuits 718, 720, 721 and 723 become "1", whereas the outputs of the OR gate circuits 719, 722, 724 and 725 become "0", thereby setting the Q outputs of flip-flop circuits 710 to 712 to "0" and the Q output of the flip-flop circuit 713 to "1". Accordingly, it becomes X1(0)=X2(0)=X3(0)="0" and X4(0)="1". At this time, since U1="1" and U2="0" as shown by the time chart shown in FIG. 9 the outputs of PLA 701 are such that W1=W2="0". Further, the output Y1="0". At time t=1, the rise of the clock pulse CL shown in FIG. 9 corresponds to the fall by the action of the inverter circuit 716 so that the flip-flop circuits 710 to 713 operate with the result that X1(1)=X2(1)=X4(1)="0", X3(1)="1". At this time, the outputs of PLA 701 are W1="1" and W2="0" and the PLA 712 produces an output Y1="0". Then at time t=2, X1(2)=X3(2)=X4(2)="0" and X2(2)="1" so that the outputs of PLA 701 are W1="1", W2="0" and the output of PLA 732 becomes Y1="0". Then at time t=3, X1(3)=X2(3)="1", X3(X3)=X4(3)="0", the outputs of PLA 701 are W1=W2="0" and the output of PLA 732 becomes Y1="0". At time t=4, X1(4)="1", X2(4)=X3(4)=X4(4)="0" so that the outputs of 701 are W1="1" and W2="0" whereas the output of PLA 732 becomes Y1="1". By repeating these operations a serial signal as shown by Y1 in the time chart shown in FIG. 9 can be obtained.

When the circuit operates from t=0 with the control inputs being C1="0" and C2="1", due to the fact that the initial state setting signal IL is "1" for the content of PROM 731 shown in FIG. 8, I1="1" and I2=I3=I4="0" so that the Q output of the flip-flop circuit 710 becomes "1" and the Q outputs of the flip-flop circuits 711 to 713 become "0". In other words X1(0)="1", X2(0)=X3(0)=X4(0)="0" and the outputs of PLA 701 are W1="1" and W2="0" whereas the output of PLA 732 becomes Y1="1". By repeating these operations, a sereal signal as shown by Y' in FIG. 9 can be produced.

While the above embodiment has been described with two inputs, three outputs (one in the actual example of the operation), and four states, the numbers of the inputs, outputs and the states may be any value. Further, in the flip-flop array shown in FIG. 7, two rows each including two serially connected flip-flop circuits were used, the number of serially connected flip-flop circuits may be different for respective rows. Although array input and output determining units 701 and 732 were respectively constituted by PLAs, they may be substituted by ROMS, RAMs etc. Similarly, the PROM 731 of the initial state setting unit 717 may be substituted by a PLA, RAM etc.

Figure 10:
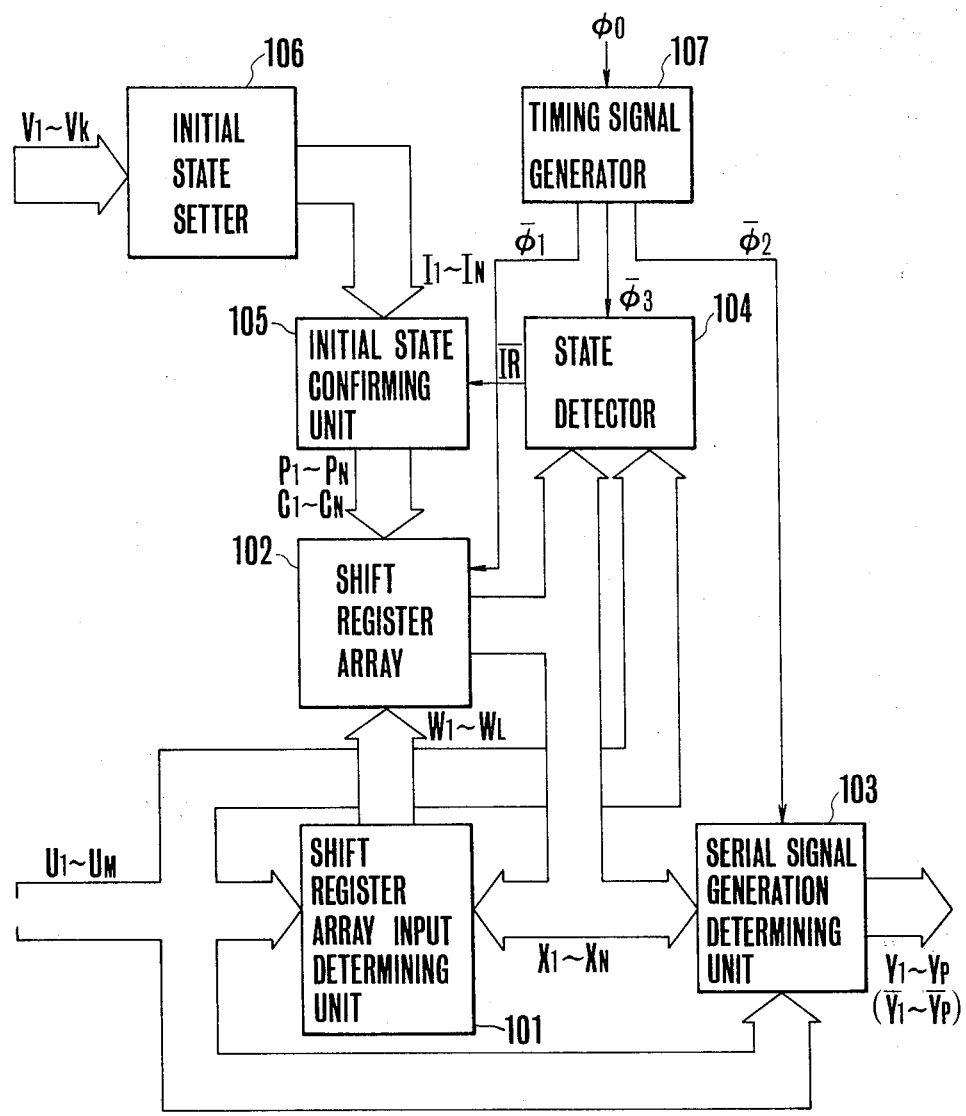
FIG. 10 is a block diagram showing still another example of the serial signal generating circuit embodying the invention.

FIG. 10 is a block diagram showing another example of a serial signal generating circuit embodying the invention which is different from that shown in FIG. 4 in that an SR-flip-flop circuit is provided on the output side, and that a timing signal generator 107, a state detector 104 and an initial state confirming unit 105 are provided to establish the state interiorly of the circuit. The state detector 104 determines the periodic length of the serial signal produced by the states X1 to Xn and control inputs U1 to Um to produce an initial state set signal IR. In response to the initial state set signal IR, the initial state confirming unit 105 produces initial state setting signals P1 to Pn and C1 to Cn which set the initial states I1 to In in a shift register array 102. The timing generator 107 produces a clock signal $\bar{\phi}1$ for the shift register array 102, a clock signal $\bar{\phi}2$ for a serial signal generation determining unit 103 and a clock signal $\bar{\phi}3$ for the state detector 104 in accordance with an external fundamental clock signal $\phi0$.

Figure 1:
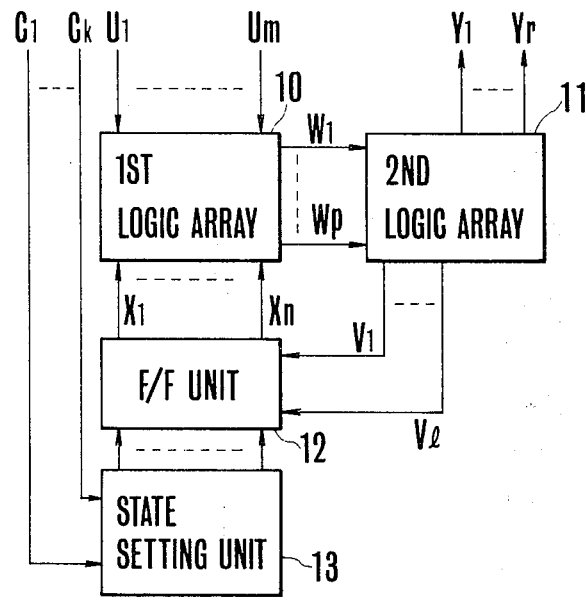
FIG. 1 is a block diagram showing the basic construction of the programmable sequential logic circuit embodying the invention.

FIG. 1 shows one example of the detail of the serial signal generating circuit shown in FIG. 10. $111_1$ shows external control signals U1 and U2, $111_2$ initial state control inputs V1 and V2, $112_1$ serial signals Y1 and $\bar{Y1}$ generated by the circuit shown in FIG. 11. Inverters $113_1$ to $113_4$ invert inputs $111_1$ and $111_2$. Reference numeral 114 shows an AND array which functions to determine the input to a shift register array and the serial signal generation determination, to detect the states, and to generate the initial state. Reference numeral 115 shows an OR array having a plurality of functions similar to the AND array 114. Reference mumerals $116_{11}$, $116_{12}$, $116_{21}$ and $116_{22}$ are D-flip-flop circuits. Flip-flop circuits $116_{11}$ and $116_{12}$ and $116_{21}$ and $116_{22}$ respectively constitute shift registers. The Q outputs of these flip-flop circuits are fed back to the AND array 114. Reference numeral 117 designates states X1 to X4, and $118_1$ to $118_4$ inverters which invert the states X1 to X4. Reference numeral 119 shows a RS-flip-flop circuit which comprises a portion of the serial signal generation determining circuit 103. Reference numeral 1110 shows a D-flip-flop circuit comprising a portion of the state detector. Reference numeral 1111 shows an initial state setting unit, 1112 shows initial states I11 to I22, that is, a portion of the output of the OR array 115. Reference numeral 1113 shows a timing signal generator which generates timing signals $\bar{\phi}1$, $\bar{\phi}2$ and $\bar{\phi}3$ in accordance with the fundamental clock signal $\phi0$, a reset signal $\overline{RESET}$ and a strobe signal $\overline{ST}$ which are applied from outside. The reset signal $\overline{RESET}$ is also applied to clear terminals CLR at RS and D flip-flop circuits 119 and 1110 and to the initial state setting unit 1111, whereas the strobe signal ST is sent to the preset terminal PR of D-flip-flop circuit 1110 and to the initial state setting unit 1111. In this example, the number of the control inputs is two, the number of the initial state control inputs is two, the number of the states is 4, the number of the serial signal generated is 1, and the number of rows of the shift registers is 2 and the number of flip-flop circuits included in each row of the shift register is 2. However, these numbers may be varied. It should be understood that the total number of flip-flop circuits included in all rows is equal to the number of states. The program of the PLA constituted by AND array 114 and OR array 115 is shown by small circles.

Figure 12:
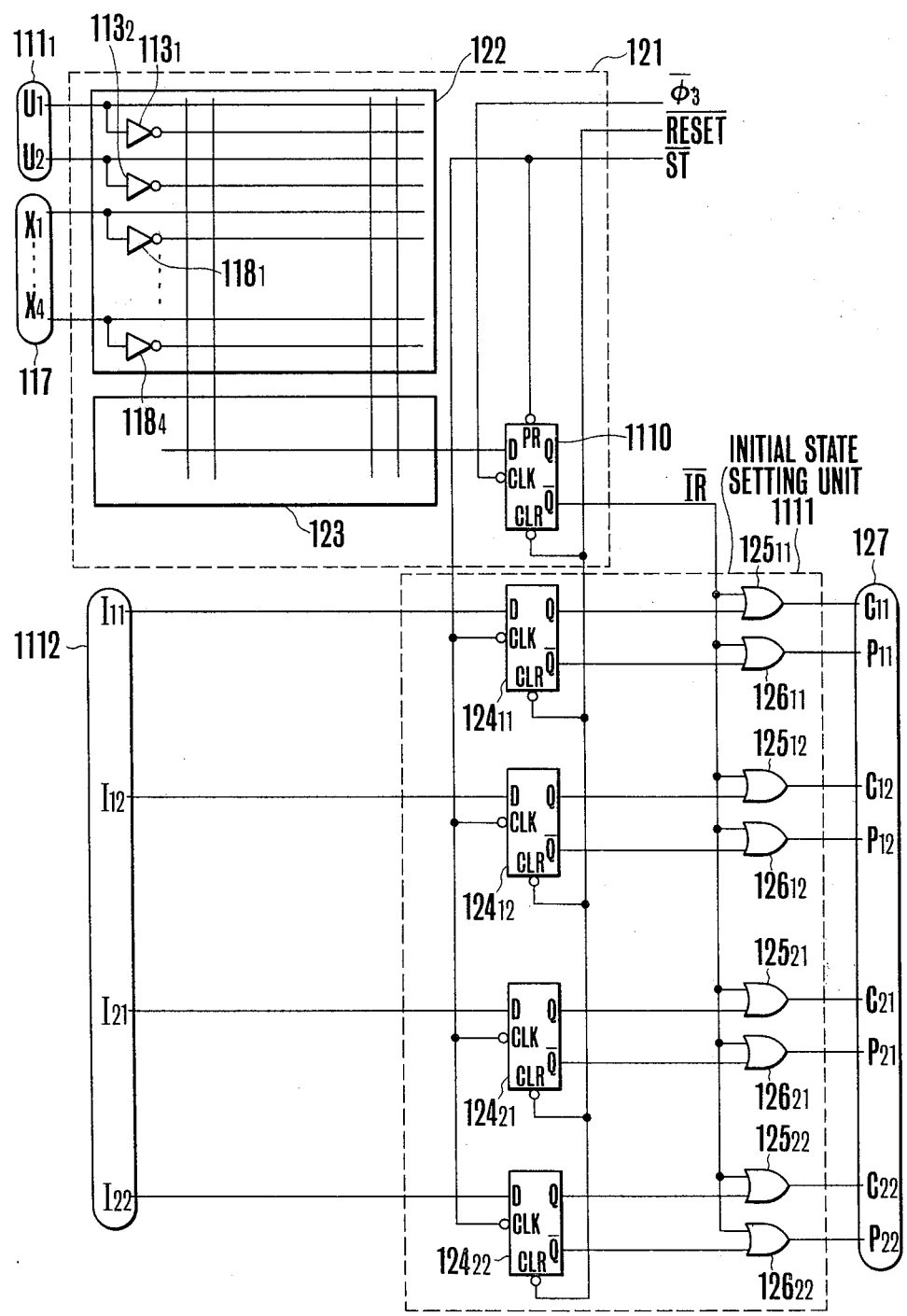
FIG. 12 is a connection diagram showing the detail of the state detector and the initial state setting unit shown in FIG. 11.

The detail of the construction of the state detector 104, the initial state confirming unit 105 and the timing signal generator 107 added to this embodiment will be described hereunder. Thus, FIG. 12 shows the detail of the state detector and the initial state confirming unit, in which elements corresponding to those shown in FIG. 11 are designated by the same reference characters. In FIG. 12, reference numeral 121 shows the state detector, $111_1$ control inputs U1 to U2, 117 states X1 to X4, $113_1$ and $113_2$ inverters which invert the control inputs $111_1$, $118_1$ to $118_4$ inverters that invert the state 117, 122 an AND array, 123 an OR array and 1110 a D-flip-flop circuit. The output of the OR array 123 is applied to the terminal D of the D-flip-flop circuit 1110 to produce an initial state set signal $\overline{IR}$ from the $\bar{Q}$ terminal thereof. The preset terminal PR of the D-flip-flop circuit 1110 is supplied with strobe signal $\overline{ST}$, the clear terminal CLR is supplied with signal $\overline{RSET}$, and the clock terminal CLK is supplied with the timing signal $\bar{\phi}3$, so that when $\overline{ST}$="0" and $\overline{CLR}$="1", Q="0", and when $\overline{ST}$="1" and $\overline{CLR}$="0", Q="1". Reference numeral 1112 shows initial states I11, I12, I21 and I22 applied to the initial state setter 1111. Reference numerals $124_{11}$, $124_{12}$, $124_{21}$ and $124_{22}$ show D-flip-flop circuits which are operated by the fall of signal $\overline{ST}$. The Q and $\bar{Q}$ terminals of the flip-flop circuit $124_{11}$ produce outputs I11 and $\overline{I11}$ respectively. The other D-flip-flop circuit operate in the same manner. Reference numerals $125_{11}$, $125_{12}$, $125_{21}$, $125_{22}$ and $126_{11}$, $126_{12}$, $126_{21}$ and $126_{22}$ show OR gate circuits. In the OR gate circuit $125_{11}$, the Q output of the D-flip-flop circuit $124_{11}$ and $\overline{IR}$ are ORed. In the OR gate circuit $126_{11}$, the $\bar{Q}$ output of the D-flip-flop circuit $124_{11}$ and IR are ORed. The other OR gate circuits operate similarly. Reference numeral 127 shows initial state set signals C11 to C22 and P11 to P22 of which C11 to C22 are applied to the clear terminals of the flip-flop circuits of the shift register array while P11 to P22 are applied to the preset terminals of the flip-flop circuits of the shift register array. When $\overline{IR}$="1" all initial state set signals become "1" and the shift register array is operated by the clock signal $\bar{\phi}1$. On the contrary when $\overline{IR}$=0, signals C11 to C22 are produced by the Q terminals of the flip-flop circuits $124_{11}$ to $124_{22}$, while signals P11 to P22 are produced by the $\bar{Q}$ terminals. Accordingly, when the initial state 1112 is preset, the flip-flop circuits of the shift register array are set to their initial states by a signal $\overline{IR}$="0" latched by the flip-flop circuit 124 at the fall of the strobe signal $\overline{ST}$.

Figure 13:
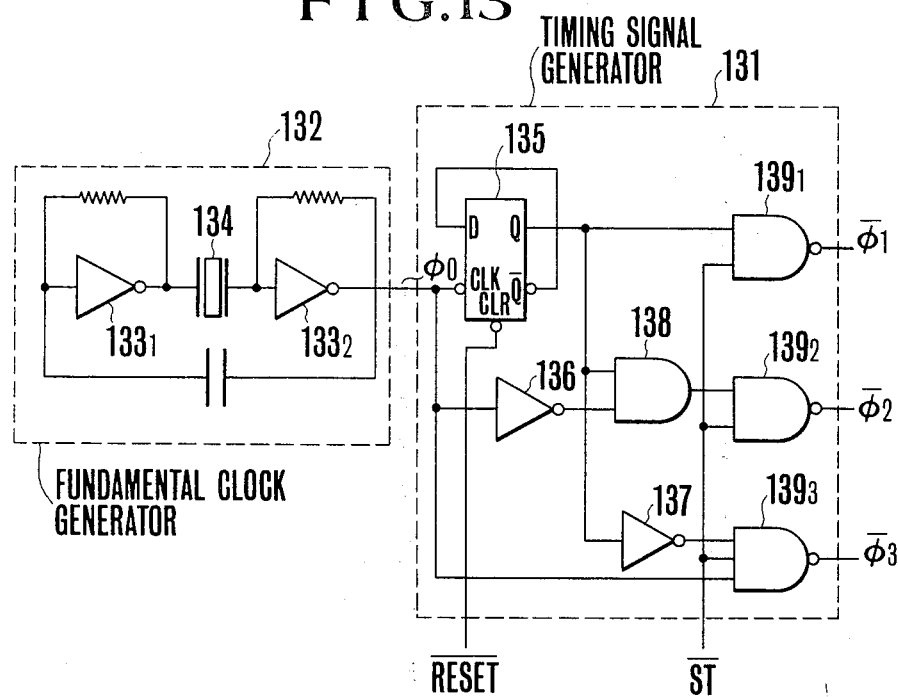
FIG. 13 is a connection diagram showing the detail of the timing signal generator shown in FIG. 11.

FIG. 13 shows the detail of the timing signal generator 1113 shown in FIG. 11. It comprises a timing signal generating unit 131, a fundamental clock generator 132 which generates a fundamental clock $\phi0$, inverters $133_1$ and $133_2$, a crystal oscillator 134, and a D-flip-flop circuit 135 which is operated at the rise of the clock pulse $\phi0$. The $\bar{Q}$ output of the flip-flop circuit 135 is fed back to its D terminal. The clear terminal of the flip-flop circuit 135 is supplied with the $\overline{RESET}$ signal from external circuit so that when $\overline{RESET}$="0", the Q output becomes "0". Reference numerals 136 and 137 show inverters, 138 an AND gate circuit, $139_1$ to $139_3$ NAND gate circuits. The timing signal generating unit 1113 produces timing signals $\bar{\phi}1$, $\bar{\phi}2$ and $\bar{\phi}3$.

Figure 14:
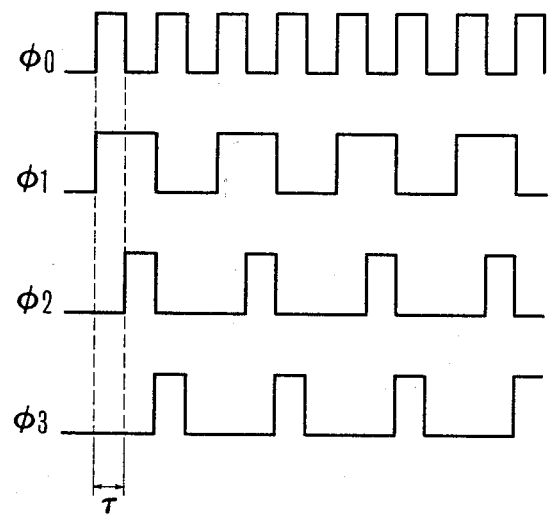
FIG. 14 is a time chart showing the timing signals generated by the timing signal generator.

FIG. 14 is a time chart showing the outputs $\bar{\phi}1$, $\bar{\phi}2$ and $\bar{\phi}3$ (in this figure $\phi0$, $\phi1$, $\phi2$ and $\phi3$) of the timing signal generating unit 1113 shown in FIG. 13. The pulse width $\tau$ is determined by taking into consideration the delay time of the PLA utilized in the shift register array input determining unit 101 and the serial signal generation determining unit 103.

Figure 15:
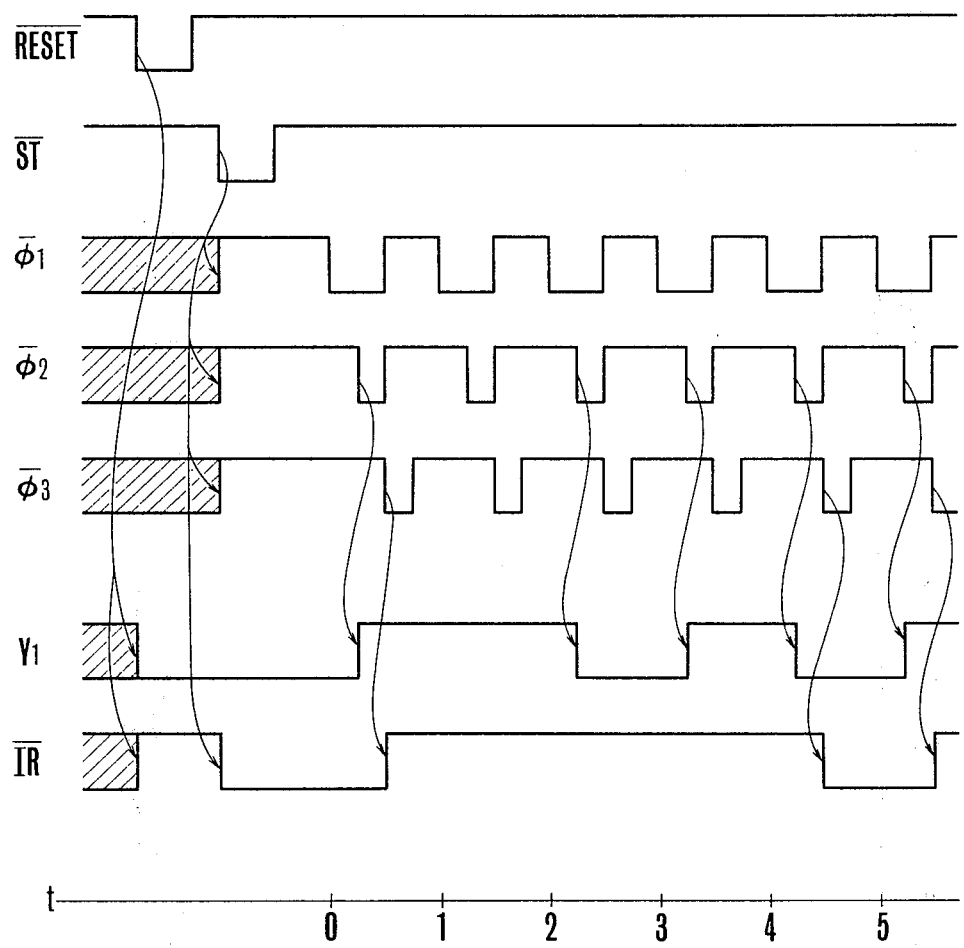
FIG. 15 is a time chart showing the serial signals generated by the circuit shown in FIG. 11.

FIG. 15 is a time chart showing the operation of the circuit shown in FIG. 11. In FIG. 15 signals $\overline{RESET}$ and $\overline{ST}$ are supplied from external circuits, $\bar{\phi}1$, $\bar{\phi}2$ and $\bar{\phi}3$ represent signals generated by the timing signal generating unit 1113. Y1 represents generated serial signal 112 supplied to external circuit, and $\overline{IR}$ the $\overline{Q}$ output of the D-flip-flop circuit 110. The control inputs function to vary the generated serial signal in real time, while the initial state control inputs vary the initial state. Before describing the operation of the circuit shown in FIG. 11, let us assume as follows: Thus, the control inputs $111_1$ are: U1="1" and U2="0", and the initial state control signals $111_2$ are: V1="1" and V2="0". These control inputs $111_1$ and $111_2$ supplied from outside are used as command signals for selecting serial signals to be generated, but it is herein assumed that only one serial signal is selected by one input.

As shown by the time chart shown in FIG. 15, in the circuit shown in FIG. 11, when the reset signal $\overline{RESET}$="0", the Q output of the flip-flop circuit 119 is "0", that is, Y1="0" and the $\overline{IR}$ of the flip-flop circuit 1110 becomes "1". Then when the strobe signal $\overline{ST}$="0", the timing signals $\bar{\phi}1$, $\bar{\phi}2$ and $\bar{\phi}3$ become "1" and the IR becomes "0". At this time, since V1=1, V2=0 and $I22=U1\bar{U2}V1\bar{V2}$, the initial states are I11=I12=I21="0" and I22="1" (the output at a point where there is no contact in the OR gate is always "0"). As described above, since $\overline{IR}$="0", the initial state setting unit 1111 produces C11=C12=C21=P21="0", and P11=P12=P21=C20="1" to set the initial value of the flip-flop circuit 116 such that X1=X2=X3="0" and X4="1". Then ST becomes "1" to cause the timing signal generating unit 1113 to generate timing signals $\bar{\phi}1$, $\bar{\phi}2$ and $\bar{\phi}3$. Since $(X1\bar{X3}v\bar{X1}X3)$ $U1\bar{U2}$ is programmed for terminal D of the D-flip-flop circuit $116_{12}$, $X1U1\bar{U2}$ for terminal D of the D-flip-flop circuit $116_{22}$, $\bar{X1}X2X3X4U1\bar{U2}$ for the D terminal of the D-flip-flop circuit 1110 and $(\bar{X1}\bar{X2}X3X4v X1\bar{X2}\bar{X3}X4)$ $U1\bar{U2}$ for the S terminal of the RS-flip-flop circuit 119 and $X1X2\bar{X3}U1\bar{U2}$ for the R terminal of the same flip-flop circuit, "0" is applied to the D terminals of D-flip-flop circuits $116_{12}$ and $116_{22}$, "0" to the D terminal of the D-flip-flop circuit 1110, "1" is to the S terminal of the RS-flip-flop circuit 119 and "0" to the R terminal thereof. Since IR="0" at the time of rise of $\bar{\phi}1$, D-flip-flop circuit 116 will not operate i.e. it will maintain its initial state. Then when $\bar{\phi}2$ falls, the RS-flip-flop circuit 119 is set to produce Y1="1". When $\bar{\phi}3$ falls next, the Q output of D-flip-flop circuit 1110 becomes "1" so as to operate the D-flip-flop circuit 116 by the next clock signal. When $\bar{\phi}1$ falls, D-flip-flop circuit 116 operates to cause X1=X2=X4="0" and X3="1". At this time "1" and "0" are inputted to the D terminals of D-flip-flop circuits $116_{12}$ and $116_{22}$ respectively, "0" is inputted to D terminal of D-flip-flop circuit 1110 and "0" is inputted to the S and R terminals of RS-flip-flop circuit 119. Accordingly, even when $\bar{\phi}2$ falls, the output of the RS-flip-flop circuit 119 will not change and at the time of fall of $\bar{\phi}3$, the Q output of the D-flip-flop circuit 1110 is still maintained at "1". The next fall of $\bar{\phi}1$ causes the D-flip-flop circuit 116 to operate to cause X1=X3=X4="0" and X2="1" so that "0" is applied to D terminal of the D-flip-flop circuits $116_{12}$ and $116_{22}$, "0" to the D terminal of the flip-flop circuit 1110, and "0" and "1" to the S and R terminals of the RS-flip-flop circuit 119. As $\bar{\phi}2$ falls, the flip-flop circuit 119 is reset to produce Y1="0", but even when $\bar{\phi}3$ falls, $\overline{IR}$ is still maintained at "1". Then as $\bar{\phi}1$ falls, X1="1", and X2=X3=X4="0" result so that "1" is inputted to D terminals of D-flip-flop circuits $116_{12}$ and $116_{22}$, "0" to D terminal of D-flip-flop circuit 1110, and "1" and "0" to the S and R terminals of RS-flip-flop circuit 119, respectively. Accordingly, as $\bar{\phi}2$ falls, Y1="1" is produced but even when $\bar{\phi}3$ falls, $\overline{IR}$ is still maintained at "1". As the $\bar{\phi}1$ falls, X1=X2="0" and X2=X4="1" result so that "0" and "1" are inputted to the S and R terminals of the RS-flipflop circuit 119, and "1" to the D terminal of the D-flip-flop circuit 1110. Thus, the fall of $\bar{\phi}2$ causes Y1="0" and that of $\bar{\phi}3$ causes $\overline{IR}$="0". At this time the initial states X1=X2=X3=0 and X4="1" are set in the D-flip-flop circuit 116. The foregoing operations are repeated when timing clock pulses $\bar{\phi}1$, $\bar{\phi}2$ and $\bar{\phi}3$ are generated.

The above description shows one example of the operation of the circuit shown in FIG. 11. Although in this embodiment, the number of control inputs was 2, that of the initial state control input was 2, the number of the serial signals generated was 1 and two shift registers each including two flip-flop circuits were used, it should be noted that these numbers may be varied. Further, although the type of the control input was limited to one, i.e. U1="1" and U2="0" it is possible to increase the types of the command with the number of the control inputs. Thus, it is possible to change the serial signal generated by changing the command signal. Further, it is possible to change the initial state by the initial state control input thus enabling a shifting, in real time of, the serial signal generated.

In this example although only one type of the initial state set signal $\overline{IR}$ and only the D-flip-flop circuit 1110 were used, it is possible to partially set the state of the shift register array by increasing the number of the D-flip-flop circuits (flip-flop 1110, in FIG. 11) of the state detector and the number of the initial state set signals. By suitably preparing a program of the PLA by feeding back a portion of the output of the RS-flip-flop circuit (flip-flop 119, in FIG. 11) to the control input and to the initial state control input, it becomes possible to automatically change the serial signal generated. Although the PLA utilized in this invention was provided with inverters for respective inputs so as to form one bit decoder system, the input decoder system may be of more than two bit system.

One example of the application of this invention to a linear sequential circuit will now be described with reference to FIG. 16. Let us consider the following linear sequential circuit.

$$\begin{pmatrix} X1(t+1) \\ X2(t+1) \\ X3(t+1) \\ X4(t+1) \\ X5(t+1) \end{pmatrix} = \begin{pmatrix} 01000 \\ 00100 \\ 10101 \\ 00001 \\ 10010 \end{pmatrix} \begin{pmatrix} X1(t) \\ X2(t) \\ X3(t) \\ X4(t) \\ X5(t) \end{pmatrix} \oplus \begin{pmatrix} 00 \\ 00 \\ 10 \\ 00 \\ 01 \end{pmatrix} \begin{pmatrix} U1(t) \\ U2(t) \end{pmatrix} \quad (1)$$

-continued $$\begin{pmatrix} Y1(t) \\ Y2(t) \\ Y3(t) \end{pmatrix} = \begin{pmatrix} 10010 \\ 01010 \\ 00101 \end{pmatrix} \begin{pmatrix} X1(t) \\ X2(t) \\ X3(t) \\ X4(t) \\ X5(t) \end{pmatrix} \oplus \begin{pmatrix} 01 \\ 10 \\ 10 \end{pmatrix} \begin{pmatrix} U1(t) \\ U2(t) \end{pmatrix} \quad (2)$$

$$\begin{pmatrix} X1(0) \\ X2(0) \\ X3(0) \\ X4(0) \\ X5(0) \end{pmatrix} = \begin{pmatrix} 1 \\ 0 \\ 0 \\ 1 \\ 0 \end{pmatrix} \quad (3)$$

where Xi (i=1 to 5), Uj (j=1, 2) and yk (k=1 to 3) represent states, input and output variables. By constructing equations (1) to (3) according to this invention, the circuit shown in FIG. 16 can be obtained.

More particularly, the portion corresponding to the first logic array shown in FIG. 1 is constituted by an AND array 161, the portion corresponding to the second logic array by EX-OR gates $162_1$ to $162_5$, and the flip-flop array 163 by two-dimensionally arranged flip-flop circuits in which the first row comprises three serially connected flip-flop circuits $163_1$ to $163_3$ and the second row comprises two serially connected flip-flop circuits $163_4$ and $163_5$. Like the preceding embodiment, a state setting unit 164 is connected to respective flip-flop circuits $163_1$ to $163_5$ via suitable gate circuits not shown. To execute the arithmetic operation of equation (1) for state variables X1 to X5 and input variables U1 and U2, cross-points of the product term lines of the AND array 161 connected to the EX-OR gate circuits $162_4$ and $162_5$ are programmed as shown in FIG. 16 and to execute the arithmetic operation of equation (2), the cross-points of the product term lines connected to the EX-OR gate circuits $162_1$ to $162_3$ are programmed as shown.

Figure 16:
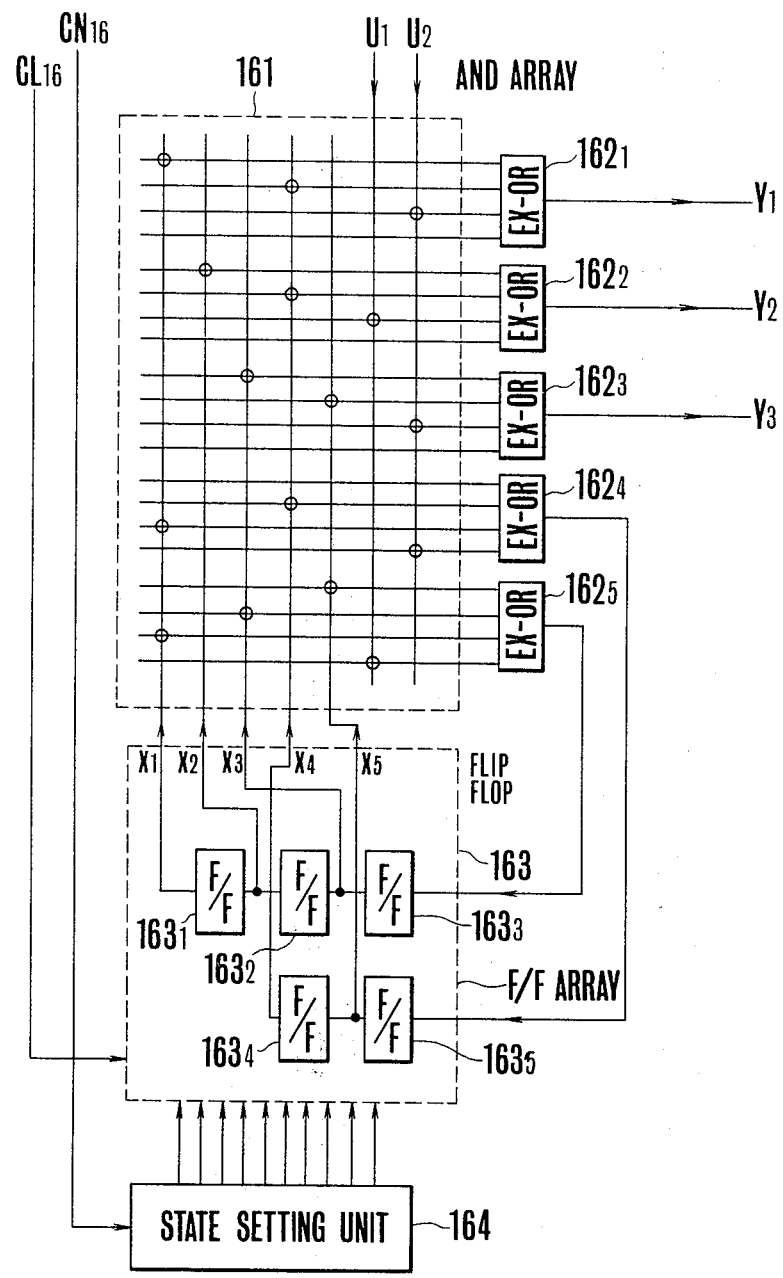
FIG. 16 is a connection diagram showing one example of a linear sequential circuit embodying the invention.

In order to operate the linear sequential circuit shown in FIG. 16, the initial state of the flip-flop array 163 is set according to equation (3) by the control input CN16 applied to the state setting unit 164. Then clock signal CL16 is applied to the flip-flop array 163 and then suitable input signals U1 and U2 are applied thereto. In this manner, a state serial signal according to equation (1) and an output serial signal according to equation (2) can be obtained.

One example of a circuit for identifying dot pattern forms to process images will now be described with reference to FIGS. 17A and 17B.

FIG. 17A shows one example of a dot pattern in terms of a 3×3 matrix. Where a black dot represents logic value "1" and a white dot a logic value "0", in order to produce an output signal D="1" in case I and an output signal S="1" in case II. According to this invention a circuit is fabricated as shown in FIG. 17B.

Figure 17B:
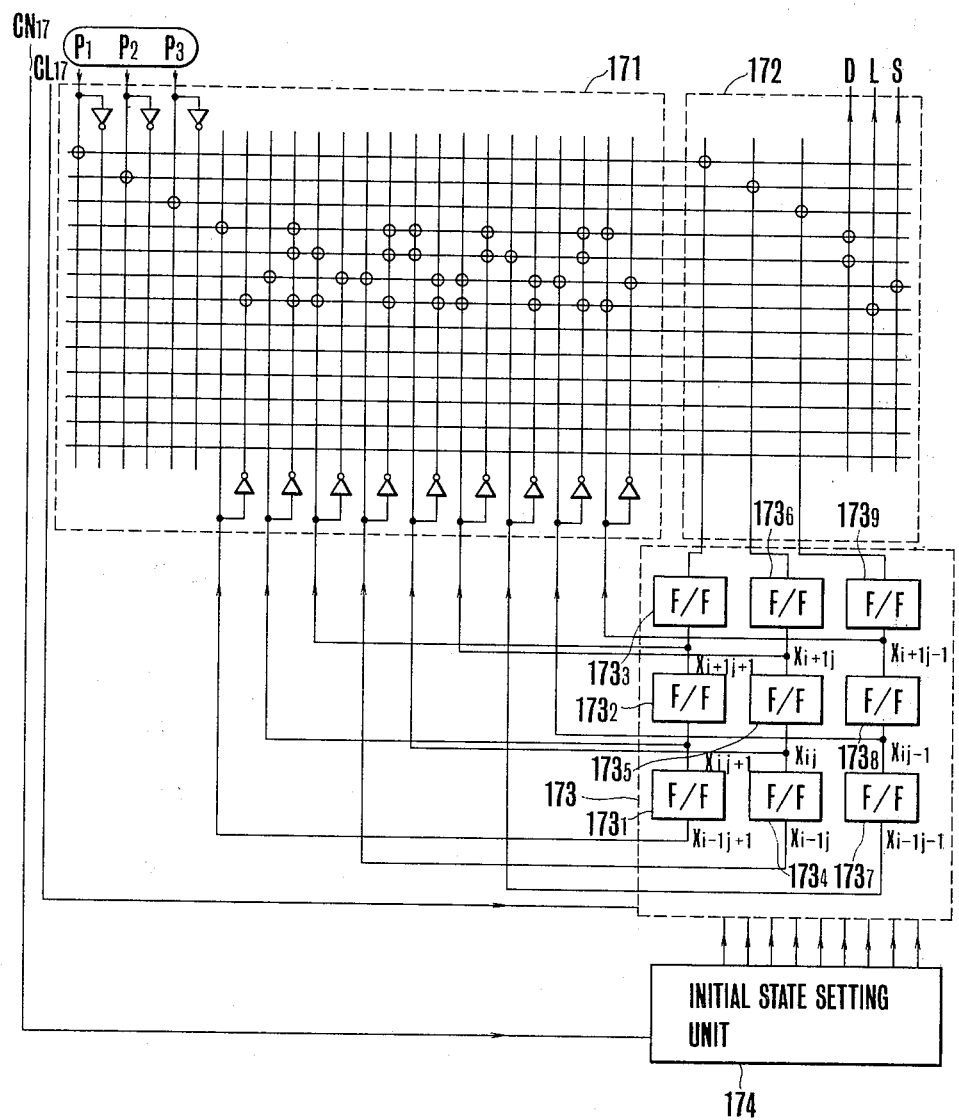
FIG. 17B is a connection diagram for executing the dot pattern matrixes shown in FIG. 17A.

In FIG. 17B, the portion corresponding to the first logic array shown in FIG. 1 is constituted by an AND gate array 171, the portion corresponding to the second logic array by an OR gate array 172, and a flip-flop array 173 by two-dimensionally arranged flip-flop circuits comprising three rows and three columns. Like the preceding embodiment an initial state setting unit 174 is connected to respective flip-flop states $173_1$ to $173_9$.

To operate the identifying circuit described above, the states of all flip-flop circuits $173_1$ to $173_9$ are set to "0" by the initial state setting unit 174 according to an external control signal $CN_{17}$. Then a clock signal $CL_{17}$ is supplied to the flip-flop array 173 so as to apply to the AND gate array 171 a three-dot pattern as input signals $P_1{}^t$ to $P_3{}^t$ (t represents a time instant), thus setting the input signals into the flip-flop circuits $173_3$, $173_6$ and $163_9$ via the OR gate array. At this time, the states of the array 173 expressed as a matrix of a 3×3 two-dimensional arrangement are $Xi+1j+1=P_1{}^1$, $Xi+1j=P_2{}^1$, $Xi+1j-1=P_3{}^1$, and $Xij+1$ to $Xi-1j-1=$"0". Thus, for example when $P_1{}^1=P_2{}^1=P_3{}^1=$"1", L="1". When the input signals $P_1{}^2$, $P_2{}^2$ and $P_3{}^2$ are inputted to the AND gate array 171 by the next clock signal, the states of the flip-flop circuits of the array 173 are $Xi+1j+1=P_1{}^2$, $Xi+1j=P_2{}^2$, $Xi+1j-1=P_3{}^2$, $Xij+1=P_1{}^1$, $Xij=P_2{}^1$, $Xij-1=P_3{}^1$, $Xi-1j+1$ to $Xi-1j-1=$"0". By repeating these operations, it becomes possible to identify the form shown in the 3×3 dot pattern in FIG. 17A.

What is claimed is:

1. A programmable sequential logic circuit device comprising:

a first logic array for producing product terms of a first and second plurality of input signals;

a second logic array having inputs coupled to said first logic array for producing sum terms of the outputs of said first logic array, said second logic array including output terminal means for manifesting sequential signals to an associated circuit;

a two-dimensional array of flip-flop circuits having a plurality of rows of stages, each stage including a plurality of serially connected flip-flop circuits, said array of flip-flop circuits further including a first input terminal group connected to outputs of said second logic array for supplying sum term signals to the inputs of respective rows of stages, a second input terminal group connected to inputs of the respective stages other than said row inputs for receiving an external control signal for setting an internal state of the array of flip-flop circuits, and output terminals connected to said first logic array for supplying state signals thereto as said first plurality of input signals; and setting means connected to said second input terminal group for generating said external control signals for setting the initial internal state of said array of flip-flop circuits and for changing said internal state for permitting an interruption during the operation of said array of flip-flop circuits, whereby said device generates said sequential signals for said associated circuit in accordance with the second plurality of input signals applied to said first logic array and the present internal state of said array of flip-flop circuits.

2. The programmable sequential logic circuit device according to claim 1 wherein said first logic array comprises an AND gate array, said second logic array comprises an exclusive OR gate array having inputs connected to product term lines of said AND gate array, the outputs of respective stages of said array of flip-flop circuits representing the internal state of said flip-flop circuits are fed back in parallel to said AND gate array, and wherein said first logic array further comprises another AND gate array and said second logic array further comprises another exclusive OR gate array with its inputs connected to product term lines of said another AND gate array, said input signals are also applied to said another AND gate array and the outputs of said stages are also fed back to said another AND gate array, thereby producing an output to said associated circuit from said another exclusive OR gate array.

3. The programmable sequential logic circuit according to claim 1 wherein said first logic array comprises an AND gate array, said second logic circuit comprises an exclusive OR gate array having inputs connected to product term lines of said AND gate array the inputs of respective rows of said array of flip-flop circuits are connected to the outputs of said exclusive OR gate array, the outputs of respective stages representing the internal state of said circuit are fed back in parallel to said AND gate array, and wherein said first logic array further comprises another AND gate array and said second logic array further comprises an OR gate array with its inputs connected to product term lines of said another AND gate array, said input signals are applied to said another AND gate array through inverters, and the outputs of said stages are fed back to said another AND gate array, thereby producing an output to said associated circuit from said OR gate array.

4. The programmable sequential logic circuit device according to claim 1 wherein said first logic array comprises an AND gate array, said second logic array comprises an exclusive OR gate array with its inputs connected to product term lines of said AND gate array, the inputs of respective rows of said array of flip-flop circuits are connected to the outputs of a portion of said exclusive OR gate array, and the outputs of respective stages of said array of flip-flop circuits representing the internal state of said flip-flop circuits are fed back in parallel to said AND gate array whereby an output to said associated circuit is derived out from said exclusive OR gate array.

5. The programmable sequential logic circuit device according to claim 1 wherein said setting means includes memory means having input terminals characterized by receiving externally supplied state signals for said device and output terminals for manifesting said state signals, and logic means having input terminals coupled to said memory means output terminals and output terminals coupled to said second input terminal group of said array of flip-flop circuits for furnishing said externally supplied state signals stored in said memory means to said array of flip-flop circuits, whereby the internal state of said array of flip-flop circuits can be initially determined by the externally supplied state signals and also altered during sequential operation of said array of flip-flop circuits by receipt of said externally supplied state signals.

* * * * *